(12) United States Patent
Chatal

(10) Patent No.: US 8,198,920 B2
(45) Date of Patent: Jun. 12, 2012

(54) LOW CURRENT COMPARATOR WITH PROGRAMMABLE HYSTERESIS

(75) Inventor: Joel Chatal, Carquefou (FR)

(73) Assignee: Atmel Corporation, San Jose, CA (US)

( * ) Notice: Subject to any disclaimer, the term of this patent is extended or adjusted under 35 U.S.C. 154(b) by 60 days.

(21) Appl. No.: 12/409,440

(22) Filed: Mar. 23, 2009

(65) Prior Publication Data
US 2010/0237908 A1 Sep. 23, 2010

(51) Int. Cl.
*H03K 5/22* (2006.01)
(52) U.S. Cl. .............................. 327/65; 327/67; 327/205
(58) Field of Classification Search .............. 327/63–65, 327/67, 205, 206, 93–97
See application file for complete search history.

(56) References Cited

U.S. PATENT DOCUMENTS

| | | | | |
|---|---|---|---|---|
| 5,546,028 A | * | 8/1996 | Yamaguchi | 327/64 |
| 5,821,780 A | * | 10/1998 | Hasegawa | 327/63 |
| 5,959,469 A | * | 9/1999 | Kurauchi et al. | 327/77 |
| 5,986,599 A | * | 11/1999 | Matsuo | 341/158 |
| 6,144,232 A | * | 11/2000 | Yukawa et al. | 327/77 |
| 6,559,688 B2 | * | 5/2003 | Ohkido | 327/69 |
| 7,622,963 B2 | * | 11/2009 | Westwick | 327/90 |

* cited by examiner

*Primary Examiner* — Long Nguyen
(74) *Attorney, Agent, or Firm* — Fish & Richardson P.C.

(57) ABSTRACT

A low current comparator with programmable hysteresis is disclosed that uses a ratio of latch intrinsic (internal) latch capacitance and capacitance of a sample capacitor to adjust hysteresis. In some implementations, the comparator includes a switch capacitor sampling stage coupled to a dynamic latch output stage. Depending on an output state (0 or 1) of the comparator, hysteresis is generated by adding or subtracting a first charge stored in the latch intrinsic capacitance to or from a second charge stored in the sampling capacitor. The ratio of latch intrinsic capacitance and the capacitance of the sampling capacitor can be adjusted to trim hysteresis value. The hysteresis function does not require additional capacitors or additional logic.

9 Claims, 4 Drawing Sheets

LOW CURRENT COMPARATOR WITH PROGRAMMABLE HYSTERESIS

TECHNICAL FIELD

This application is related generally to electronic devices, and more particularly to comparators with programmable hysteresis.

BACKGROUND

In many applications, comparators only function over a portion of a time period. Such circuits are driven by a clock and have a first (sampling) phase when the comparator output is not available and a second (amplifying) phase when the comparator output is available. Some of these comparators can include one or more preamplifier stages followed by a latch stage. When a low offset is required, the preamplifier stage(s) can build up an input voltage difference to a sufficiently large value and then apply the input voltage to the latch stage to decrease the effect of latch offset. When low power is required, a dynamic latch can be used.

The conventional comparator described above works well for some applications. However, when a very low operational current (e.g., 100 nA) and hysteresis are required, the linear preamplifier stage(s) cannot be used.

SUMMARY

A low current comparator with programmable hysteresis is disclosed that uses a ratio of latch intrinsic (internal) capacitance and capacitance of a sample capacitor to adjust hysteresis. In some implementations, the comparator includes a switch capacitor sampling stage coupled to a dynamic latch output stage. Depending on an output state (0 or 1) of the comparator, hysteresis is generated by adding or subtracting a first charge stored in the latch intrinsic capacitance to or from a second charge stored in the sampling capacitor. The ratio of latch intrinsic capacitance and the capacitance of the sampling capacitor can be adjusted to trim hysteresis value. The hysteresis function does not require additional capacitors or additional logic.

DETAILED DESCRIPTION

Figure 1:
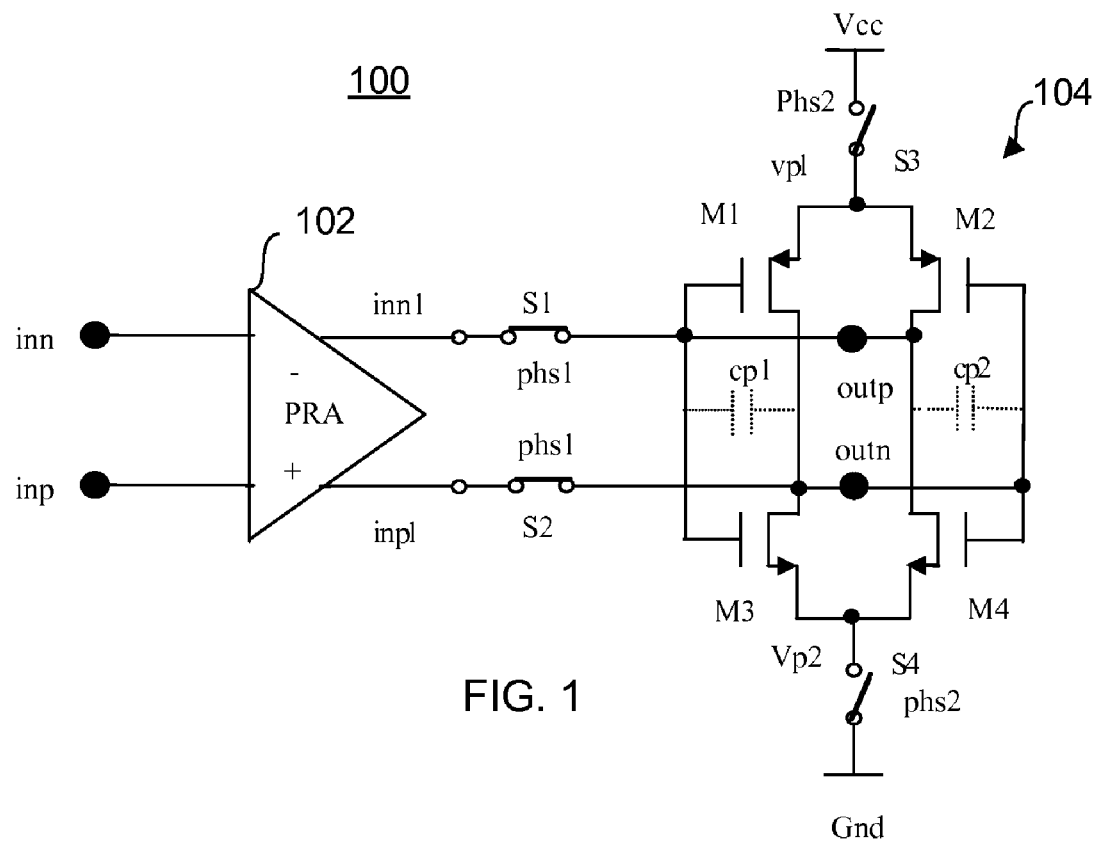
FIG. 1 is a schematic diagram of a comparator in a sampling state.

FIG. 1 is a schematic diagram of a comparator 100 operating in a sampling phase. The comparator 100 includes a linear preamplifier 102 coupled to a dynamic latch 104 through switches S1 and S2. Capacitors cp1 and cp2 are gate_to_drain capacitors of MOS transistors M1, M3 and M2, M4, respectively. During a sampling phase (phs1=1, phs2=0), the input signal between inp and inn is continuously amplified. The differential outputs inn1, inp1 of the preamplifier 102 are applied to the inputs of the dynamic latch 104 through switches S1 and S2. Power switches S3, S4 are open. As M1, M3 and M2, M4 inverters are cross connected and S3, S4 power switches are open, the outputs of preamplifier 102 are applied to an equivalent capacitor equal to cp1+cp2 during the sampling phase, creating a voltage difference between outp and outn.

Figure 2:
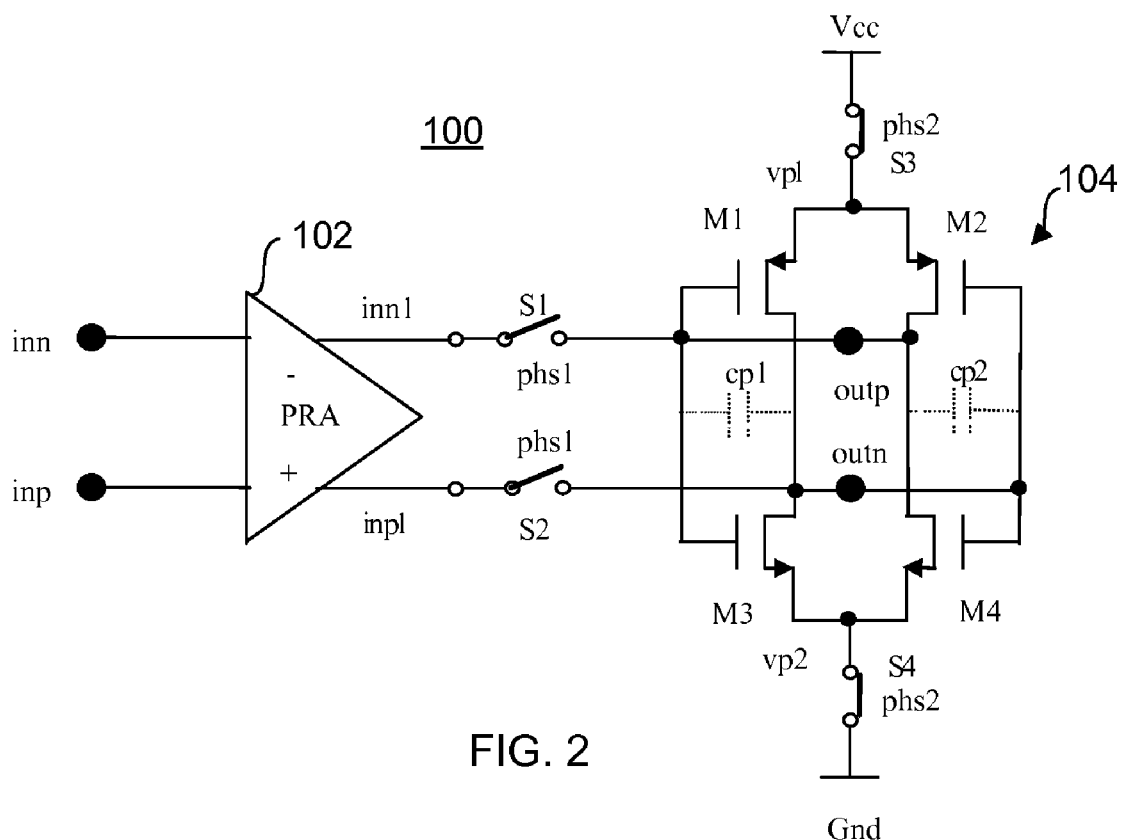
FIG. 2 is a schematic diagram of the comparator of FIG. 1 in an amplifying state.

FIG. 2 is a schematic diagram of the comparator 100 operating in an amplifying phase. During the amplifying phase (phs1=0, phs2=1), the inputs of dynamic latch 104 are disconnected from the outputs of preamplifier 102 by opening switches S1 and S2. The charge stored in cp1, cp2 and the voltage difference between outp and outn remains. Then, power switches S3 and S4 are closed, and the dynamic latch 104 formed by transistors M1, M3 and M2, M4 cross coupled inverters enters an unstable state and the outputs outp, outn of comparator 100 flip to 0,1 or 1,0, depending on a voltage difference polarity at the end of the previous sampling period.

Figure 3:
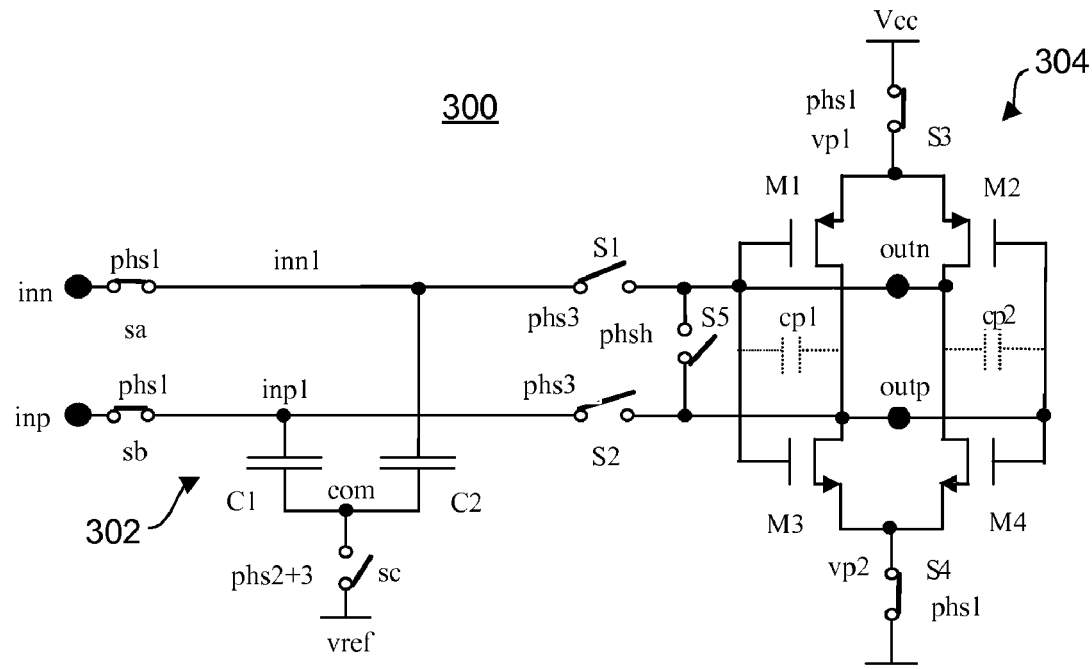
FIG. 3 is a schematic diagram of an example low current comparator with programmable hysteresis in a sampling and amplification state.

FIG. 3 is a schematic diagram of an example low current comparator 300 with programmable hysteresis in a sampling and amplification state. In comparator 300, the preamplifier has been removed. In place of the preamplifier, the comparator 300 includes a sampling input stage 302 and a dynamic latch output stage 304. The input and output stages 302, 304 are operatively coupled by switches S1 and S2. In some implementations, the sampling input stage 302 is a switched capacitor structure that includes sampling capacitors C1 and C2 and switches sa, sb, sc, S1 and S2. The dynamic latch output stage 304 includes transistors M1, M2, M3, M4, and switches S3, S4, S5. The transistors M1 through M4 are shown in a cross-coupled inverter arrangement. The dynamic latch output stage 304 has intrinsic gate to drain capacitance cp1 and cp2.

Figure 6:
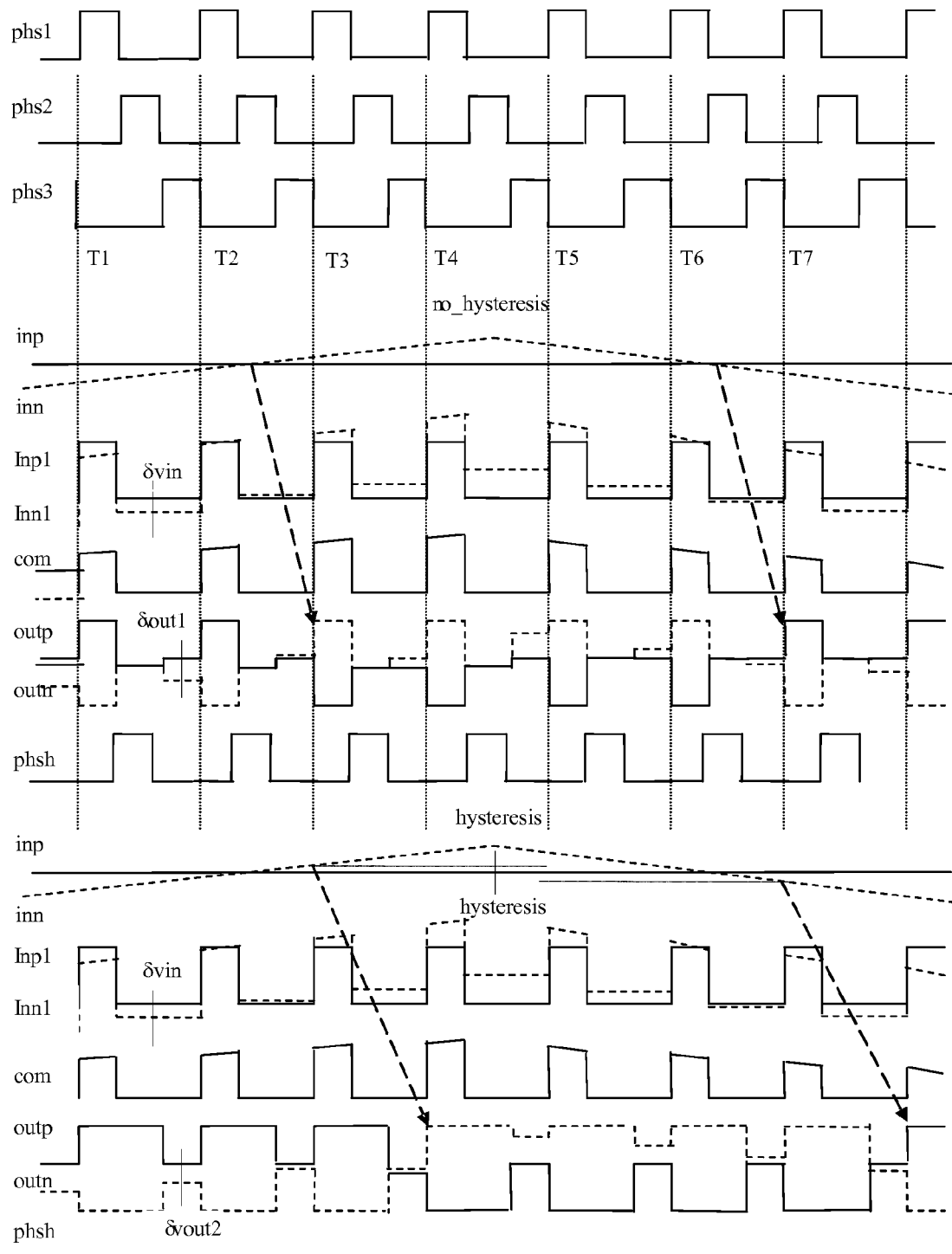
FIG. 6 illustrates example waveforms for controlling the state of the low current comparator of FIGS. 3-5.

The operating state of comparator 300 is controlled by three-phase, non-overlapped clocks: Phs1, Phs2 and Phs3. The waveforms for these clocks are shown in FIG. 6. During a first phase (e.g., phs1=1), inp and inn input signals are sampled in C1,C2 serial capacitors and through sa and sb switches. Since switch sc is open, the capacitors C1, C2 are coupled to inn1 and inp1 and to a common node ("com"). The common node Com is floating and biased to [v(inp)+v(inn)]/2. The voltage difference across inp1 and inn1 is δvin. During the same phase, S3 and S4 power switches are closed, switch S5 is opened, and the dynamic latch 304 formed by M1, M3 and M2, M4 cross-coupled inverters transitions to an unstable state. The outputs outp and outn of comparator 300 flip to 0,1 or 1,0 depending on a voltage difference polarity at the end of a previous sampling period.

Figure 4:
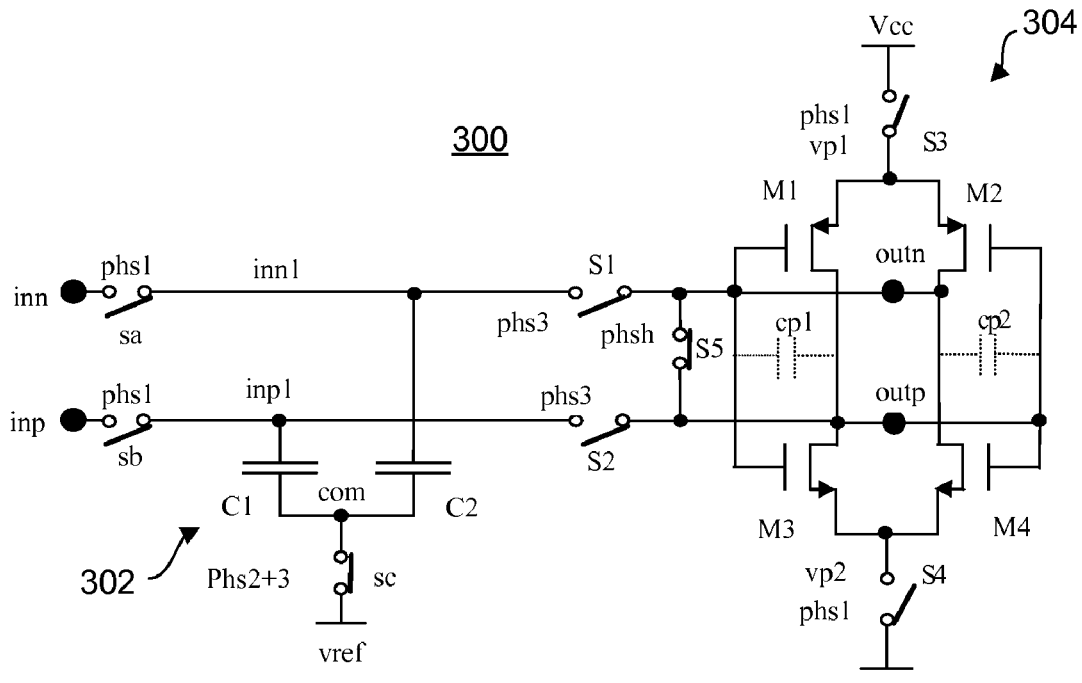
FIG. 4 is a schematic diagram of the low current comparator of FIG. 3 in a level shift and latch discharge state with no hysteresis.

FIG. 4 is a schematic diagram of the low current comparator of FIG. 3 in a level shift and latch discharge state with no hysteresis. During a second phase (e.g., phs2=1), sampling capacitors C1,C2 are disconnected from inp and inn by opening switches sa, sb, switch sc is closed, and the common node is biased to vref voltage (e.g., vref=Vcc/2). If no hysteresis is needed, power switches S3 and S4 are opened, switch S5 is closed, and the charge stored in the latch intrinsic capacitance cp1+cp2 is discharged to 0, resulting in v(outp)=v(outn). If hysteresis is needed, switch S5 remains open and a Qh=+−Vcc*(cp1+cp2) charge is maintained inside cp1+cp2, then v(outp)−v(outn) remains to +−Vcc, depending on the output value of comparator 300.

Figure 5:
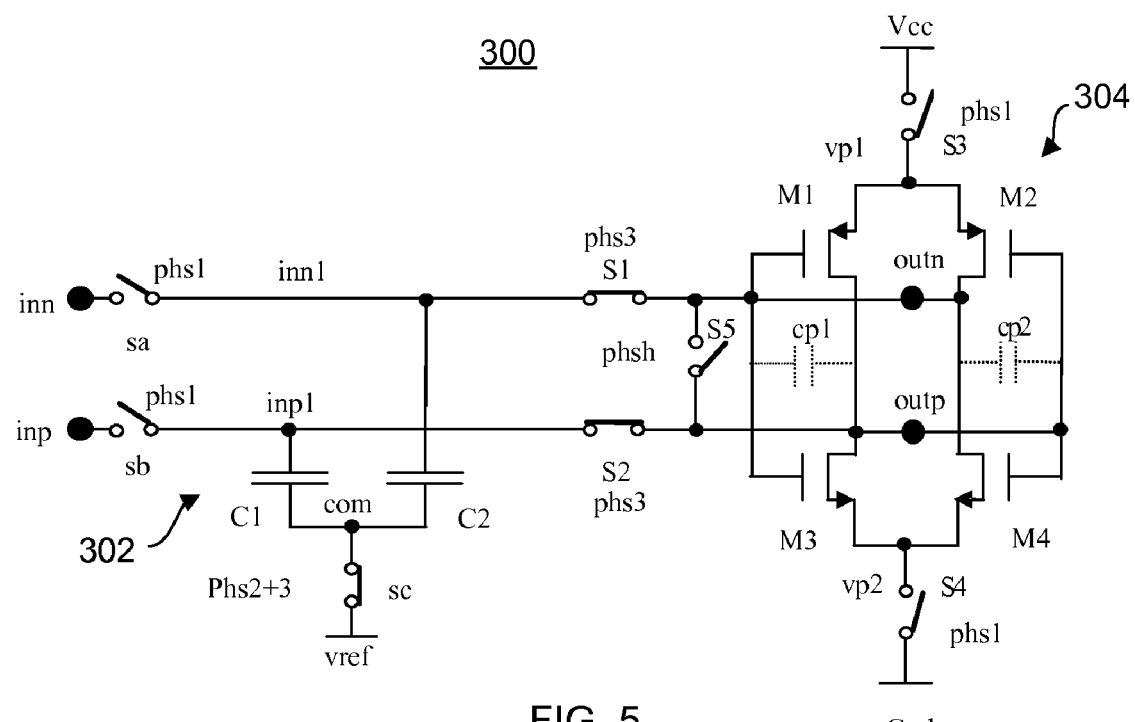
FIG. 5 is a schematic diagram of the low current comparator of FIG. 3 in a level shift and latch pre-charge state with hysteresis.

FIG. 5 is a schematic diagram of the low current comparator 300 of FIG. 3 in a level shift and latch pre-charge state with hysteresis. During a third phase (e.g., phs3=1), switch S5 is opened, switches S1,S2 are closed and the latch intrinsic capacitor (cp1+cp2) is charged by sampling capacitors C1, C2 (hereinafter referred to as "C12"). Depending on hysteresis selection, the voltage v(outp)−v(outn) across cp1+cp2 is given by $$\delta vout1 = \delta vin*C12/(C12+cp1+cp2), \quad (1)$$

where C12=C1*C2/(C1+C2), if the no-hysteresis mode is selected, and $$\delta vout2 = (\delta vin*C12-Qh)*C12/(C12+cp1+cp2) \quad (2)$$

with Qh=+−Vcc*(cp1+cp2), if the hysteresis mode is selected. In the latter case, δvout2 depends on the comparator's previous state, which generates a comparator hysteresis given by $$Hys = 2*Vcc*(cp1+cp2)*C12/(C12+cp1+cp2)$$
$$= 2*Qh*C12/(C12+cp1+cp2). \quad (3)$$

As shown in Equation [2], the ratio of the latch intrinsic capacitance (cp1+cp2) and the sampling capacitance (C12) can be used to adjust hysteresis. During a third phase (Phs3=1), the ratio can be used to add or subtract a charge stored in the latch intrinsic capacitance cp1+cp2, during an amplifying phase (Phs1=1). This charge will be added to the charge stored in the C12 capacitor during the first phase, if v(inp)−v(inn) has the same polarity compared to the polarity present in the previous amplifying phase. The charge will be subtracted from the charge stored in the C12 capacitor during the first phase if v(inp)−v(inn) has an opposite polarity compared to the polarity present in the previous amplifying phase.

FIG. 6 illustrates example waveforms for controlling the state of the low current comparator 300 of FIGS. 3-5. At the top of FIG. 6, the three phased clocks (Phs1, Phs2, Phs3) are shown over seven time periods T1-T7. As previously described, these three clocks can be used to open or close the various switches in the comparator 300. Waveforms are also shown for inputs inp, inn, Inp1, Inn1, common node com, outputs outp, outn, and clock Phsh for opening and closing switch S5. In the no-hysteresis mode, v(outp−outn) polarity changes when vinp=vinn. In the hysteresis mode, v(outp−outn) polarity changes when v(vip−vin)>Hys/2 or v(vip−vin)<−Hys/2.

What is claimed is:

1. A comparator comprising:
a sampling input stage including a sampling capacitor;
a switch to toggle the comparator between a hysteresis mode and a no-hysteresis mode; and
a dynamic latch output stage coupled to the sampling input stage during the hysteresis mode, the dynamic latch output stage including an intrinsic latch capacitor, the dynamic latch output stage operable to generate hysteresis by adding or subtracting a first charge stored in the intrinsic latch capacitor to or from a second charge stored in the sampling capacitor.

2. The comparator of claim 1, wherein a ratio of the intrinsic latch capacitance and sampling capacitance is adjustable to trim a hysteresis value.

3. The comparator of claim 1, wherein the first charge is added to or subtracted from the second charge based on an output state of the comparator.

4. The comparator of claim 3, wherein the output state of the comparator depends on a voltage difference polarity on inputs of the dynamic latch output stage.

5. The comparator of claim 1, where the sampling capacitor includes a first capacitor and a second capacitor, the sampling input stage further comprising:
a first input terminal coupled in series to the first capacitor during a sampling mode; and
a second input terminal coupled in series to the second capacitor during the sampling mode,
wherein the first and second capacitors are further coupled to a common node.

6. The comparator of claim 1, where the dynamic latch output stage further comprises:
an arrangement of cross-coupled inverters, where the intrinsic latch capacitor comprises latch intrinsic gate to drain capacitances.

7. The comparator of claim 1, where the hysteresis is given by $$Hys = \frac{2*Qh*C12}{(C12+cp1+cp2)},$$

where Qh=+/−$V_{cc}$*(cp1=cp2), and
where Vcc is a voltage source, cp1 and cp2 are the intrinsic latch capacitance and C12 is the sampling capacitance.

8. A method performed by a comparator including a sampling capacitor and a dynamic latch coupled to the sampling capacitor during a hysteresis mode, the dynamic latch including an intrinsic latch capacitor, the method comprising:
causing the comparator to configure into a level shift and latch pre-charge state with hysteresis, including toggling a switch to configure the comparator from a no-hysteresis mode to a hysteresis mode;
charging the intrinsic latch capacitor using the sampling capacitor; and
causing the comparator to configure into an amplifying state, where the hysteresis generated by the comparator during the amplifying state is based on a ratio of sampling capacitor capacitance and the intrinsic latch capacitance.

9. The method of claim 8, where causing the comparator to configure into an amplifying state includes configuring a number of switches in the comparator to open or close, resulting in the adding or subtracting of charges in the sampling capacitor and the intrinsic latch capacitor.

* * * * *